(12) United States Patent
White et al.

(10) Patent No.: US 6,696,688 B2
(45) Date of Patent: Feb. 24, 2004

(54) APPARATUS FOR MAGNETICALLY SCANNING AND/OR SWITCHING A CHARGED-PARTICLE BEAM

(75) Inventors: Nicholas White, Wenham, MA (US); Edward Bell, Newbury, MA (US); Philip Harvey, Hampton Falls, NH (US)

(73) Assignee: Diamond Semiconductor Group, LLC, Gloucester, MA (US)

( * ) Notice: Subject to any disclaimer, the term of this patent is extended or adjusted under 35 U.S.C. 154(b) by 91 days.

(21) Appl. No.: 09/949,072

(22) Filed: Sep. 7, 2001

(65) Prior Publication Data

US 2002/0109099 A1 Aug. 15, 2002

Related U.S. Application Data

(60) Provisional application No. 60/231,190, filed on Sep. 7, 2000.

(51) Int. Cl.[7] .............. G21K 1/08; H01J 3/14; H03F 3/38
(52) U.S. Cl. ................. 250/396 ML; 330/10
(58) Field of Search .......... 250/396 ML, 396 R, 250/397, 492.2; 330/10

(56) References Cited

U.S. PATENT DOCUMENTS

| | | | |
|---|---|---|---|
| 1,645,304 A | 10/1927 | Slepian | |
| 2,602,751 A | 7/1952 | Robinson | 99/221 |
| 2,697,167 A | 12/1954 | Kerst | 250/27 |
| 3,660,658 A | 5/1972 | Leboutet et al. | 250/49.5 |
| 3,787,696 A | 1/1974 | Dao et al. | 250/311 |
| 3,975,687 A | 8/1976 | Tan et al. | 325/304 |
| 4,063,098 A | 12/1977 | Enge | 250/396 |
| 4,276,477 A | 6/1981 | Enge | 250/398 |
| 4,434,372 A | 2/1984 | Cleland | 250/400 |
| 4,442,352 A | 4/1984 | Brahme | 250/251 |
| 4,494,005 A | 1/1985 | Shibata et al. | 250/492.2 |
| 4,701,623 A | 10/1987 | Beasley | 250/492.2 |
| 4,922,106 A | 5/1990 | Berrian et al. | 250/492.2 |
| 5,017,789 A | 5/1991 | Young et al. | 250/396 |
| 5,132,544 A | 7/1992 | Glavish | 250/492.2 |
| 5,393,984 A | 2/1995 | Glavish | 250/396 |
| 5,401,973 A | 3/1995 | McKeown et al. | 250/492.3 |
| 5,434,420 A | 7/1995 | Mckeown et al. | 250/396 |
| 5,483,077 A | 1/1996 | Glavish | 250/492.2 |
| 6,005,316 A | * 12/1999 | Harris | 310/90.5 |

FOREIGN PATENT DOCUMENTS

JP    5-47344 A    2/1993

OTHER PUBLICATIONS

White N. R. "Ion Beams for Radiocarbon Dating—The production, transport and measurement of $C^-$ beams for high energy mass spectrometry", Oxford University, 1981.

* cited by examiner

Primary Examiner—Stephen D. Meier
Assistant Examiner—Alfred E Dudding
(74) Attorney, Agent, or Firm—Lahive & Cockfield, LLP

(57) ABSTRACT

An apparatus is provided for one-dimensional magnetic scanning or switching of a charged particle beam. The apparatus can be extended to two dimensions at the cost of added complexity.

46 Claims, 11 Drawing Sheets

APPARATUS FOR MAGNETICALLY SCANNING AND/OR SWITCHING A CHARGED-PARTICLE BEAM

RELATED APPLICATION

The current application claims priority from Provisional Patent Application Ser. No. 60/231,190 entitled APPARATUS FOR MAGNETICALLY SCANNING AND/OR SWITCHING A CHARGED-PARTICLE BEAM which was filed on Sep. 7, 2000, all naming the same inventors and the same assignee as this application, which is incorporated by reference herein.

BACKGROUND OF THE INVENTION

This invention concerns apparatus and methods for scanning and switching charged particle beams with a periodic or quasi-periodic waveform, using a magnetic deflector. The use of magnetic deflectors and electrostatic deflectors for ion beams has been known since the Aston Mass Spectrometer. Both magnetic and electrostatic scanners have been used for scanning electron beams in cathode ray tubes, and methods for controlling non-linearities have been developed. The same scanning methods have been used in ion implanters for scanning ion beams across semiconductor wafers using both two-dimensional electrostatic scanning and one-dimensional magnetic scanning in combination with a one-dimensional "slow" translation. Fast switching and scanning magnets must be made of laminated steel, as in a transformer, to minimize losses from eddy currents.

In the Proceedings of $1^{st}$ conference on radiocarbon dating with accelerators, held at the University of Rochester in 1978, a system was disclosed in which beams of three isotopes of carbon were sequentially switched through an accelerator by switching a potential through which the ions were accelerated upon entering an analyzing magnet, the ions being retarded by an equal amount on leaving the magnet, this is illustrated in FIG. 1a.

FIG. 1b illustrates a known apparatus designed by the General Ionex Corporation in Massachusetts. FIG. 1b illustrates an apparatus in which beams of three isotopes of carbon were sequentially switched through an accelerator by rapidly changing the field of an analyzing magnet. The magnet was manufactured from laminated steel, which for convenience was cut from commercial transformer laminations, to permit the field to be changed rapidly without incurring eddy current losses.

The Thesis of, D. Phil White, Oxford University, England, 1981, disclosed a functional apparatus for implementing this scheme with a slew rate of 33.75 degrees in 25 microseconds, sequentially switching the isotopes $^{14}C$, $^{13}C$ and $^{12}C$ through an accelerator with steady periods in between, at repetition frequencies of 10 to 50 Hz. However, it was recognized that the ion-optical properties of this system, although similar, were not identical for the three isotopes.

FIG. 2 illustrates the prior art laminated magnet of U.S. Pat. No. 4,276,477 of Enge. Enge discloses an ion implanter in which an ion beam was slowly scanned across the path of a plurality of targets, which were moved through the beam on a spinning disk. The scanning speed was very slow, around 0.5 Hz. The angles of the scanned trajectories were rendered parallel by a constant shaped-field corrector magnet. The beam passed through an analyzer magnet prior to scanning, and the analyzer magnet was oriented so its dispersive plane was orthogonal to the scanning plane. The resolving aperture was located at a position downstream of the scanner magnet. Because the intended doses were high, and a batch of wafers was implanted (rather than single wafers), the slow scan frequency was acceptable.

FIGS. 3a, 3b and 3c illustrate the prior art system disclosed in U.S. Pat. No. 4,922,106 of Berrian et al. Berrian et al discloses an ion implanter for implanting single wafers in which an analyzed beam is scanned electrostatically at a frequency close to 1 kHz is disclosed. Again the angles in the scanned beam are corrected by a constant shaped-field corrector magnet. The scanning waveform was tailored to achieve a uniform implant.

SUMMARY OF THE INVENTION

The present invention addresses the above-identified limitations of conventional systems that magnetically switch or scan or both, a charged particle beam. The present invention provides an approach to enable an ion beam system for use as an ion implanter or a mass spectrometer that quickly and accurately switches between beams of different ion species. The present invention also provides an approach to scan a single ion species quickly at a precisely controlled velocity across a target.

In one embodiment of the present invention, an apparatus is provided for deflecting a charged particle beam by means of a time-varying varying magnetic field emitted by a magnet with a laminated magnetic core and a non-conductive vacuum chamber placed in a gap of the laminated magnetic core. The charged particle beam travels in the vacuum through the time varying magnetic field to switch between beams of different ion species or to scan a single ion species with a controlled velocity across a target. The vacuum chamber includes multiple thin annular sheets of metal or of another conductive material placed within the vacuum chamber to dispose the charged particle beam that passes through holes in each annular sheet without striking the non-conductive vacuum chamber walls. Each annular sheet is electrically connected to each other in a manner that suppresses eddy currents that would otherwise be induced by the time-varying magnetic field.

DETAILED DESCRIPTION OF THE INVENTION

Figure 1A:
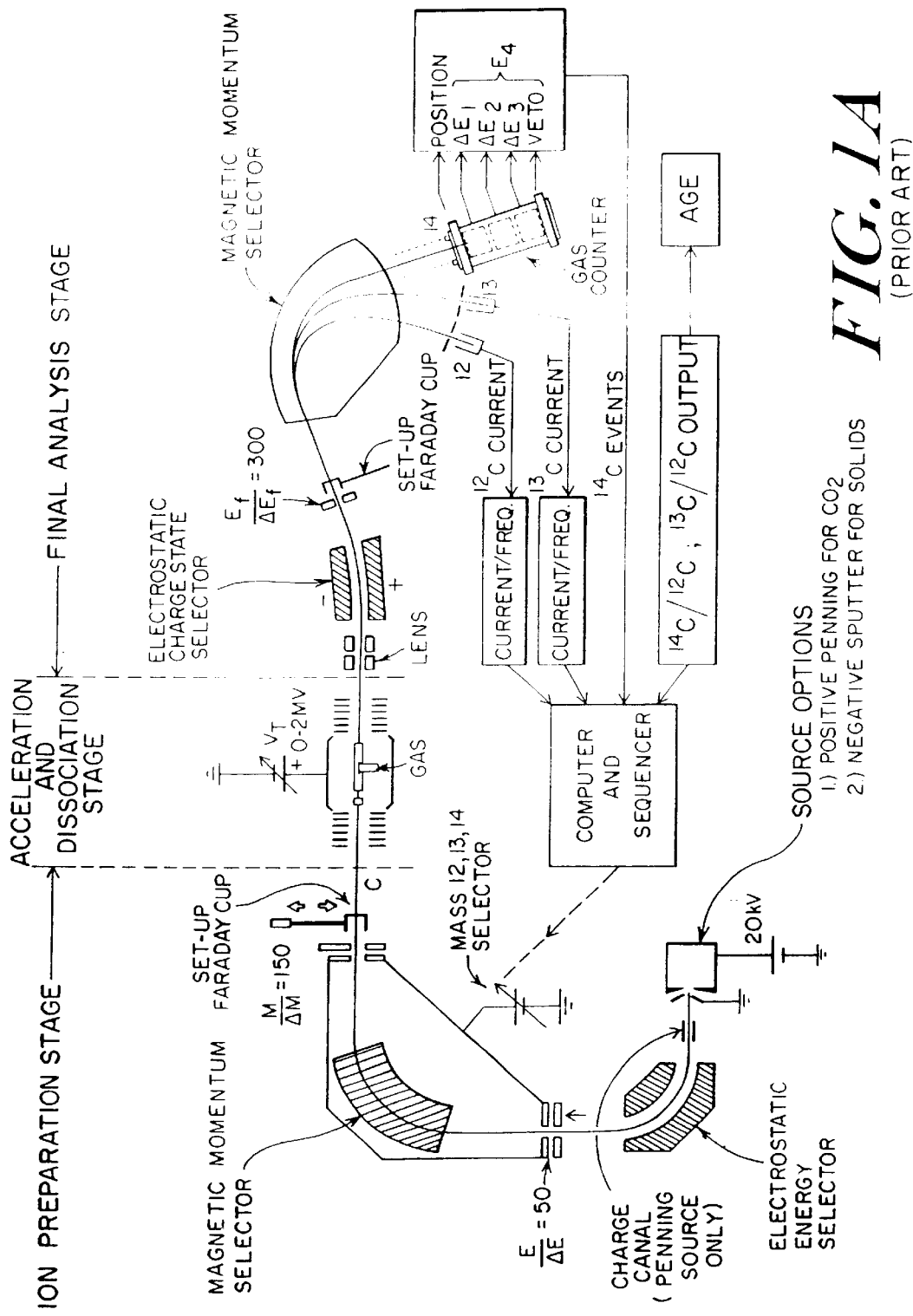
FIG. 1a illustrates the magnet "bouncer" of General Ionex Corporation of Massachusetts.
Figure 1B:
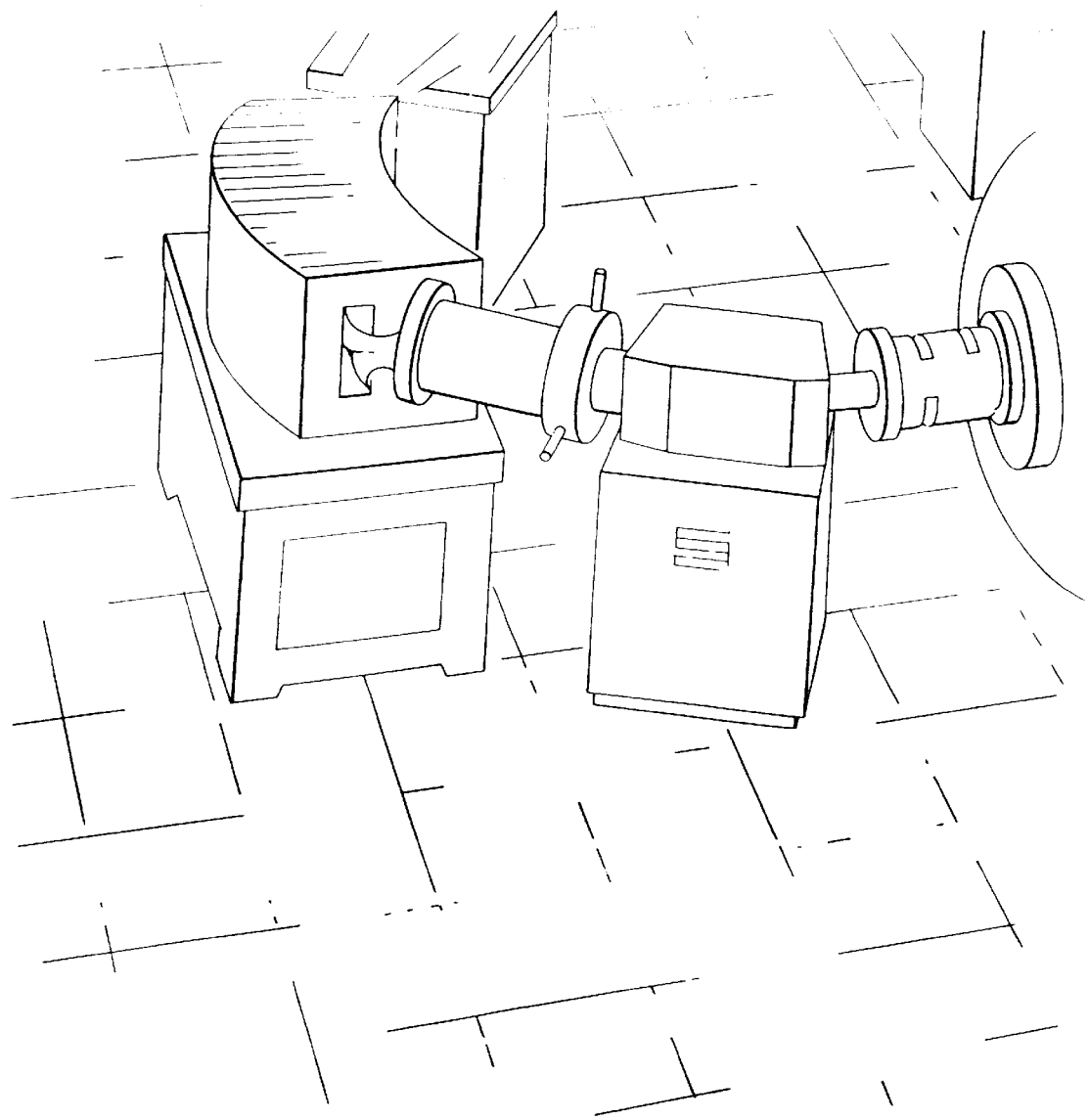
FIG. 1b illustrates the laminated magnet of General Ionex Corporation of Massachusetts.
Figure 2:
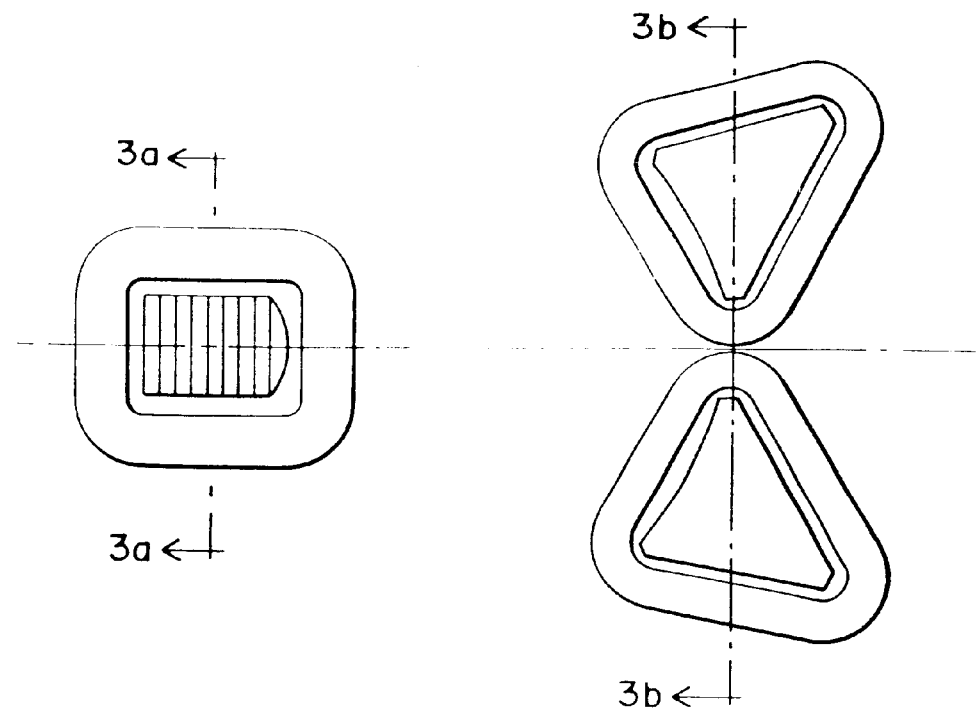
FIG. 2 illustrates the system disclosed in U.S. Pat. No. 4,276,477 of Enge.
Figure 2:
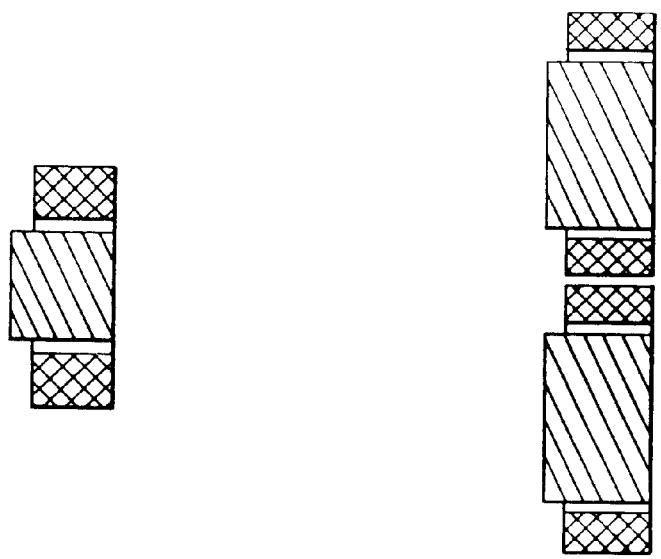
Figure 3A:
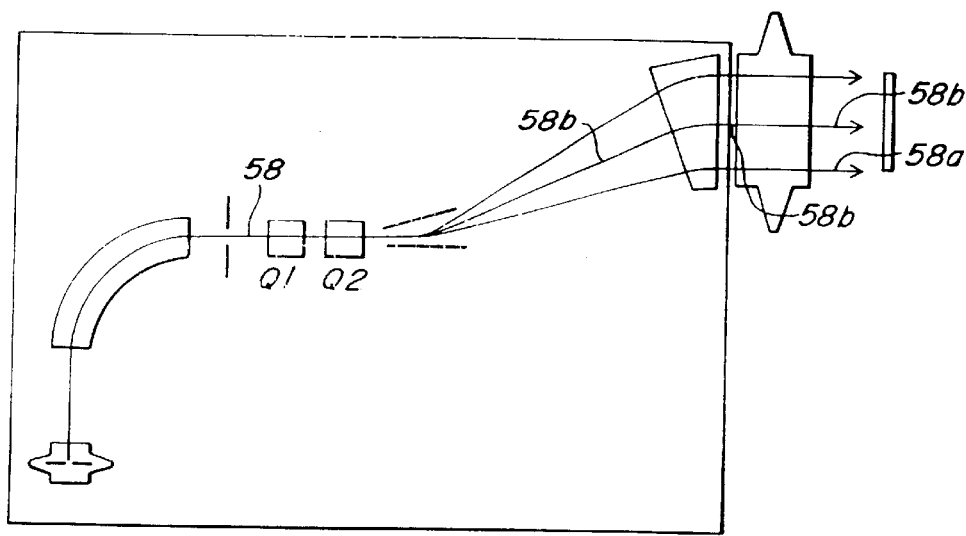
FIGS. 3a, 3b and 3c illustrate the disclosed in U.S. Pat. No. 4,922,106 of Berrian et al. including a representative scanning waveform of the disclosed ion beam scanning system.
Figure 3B:
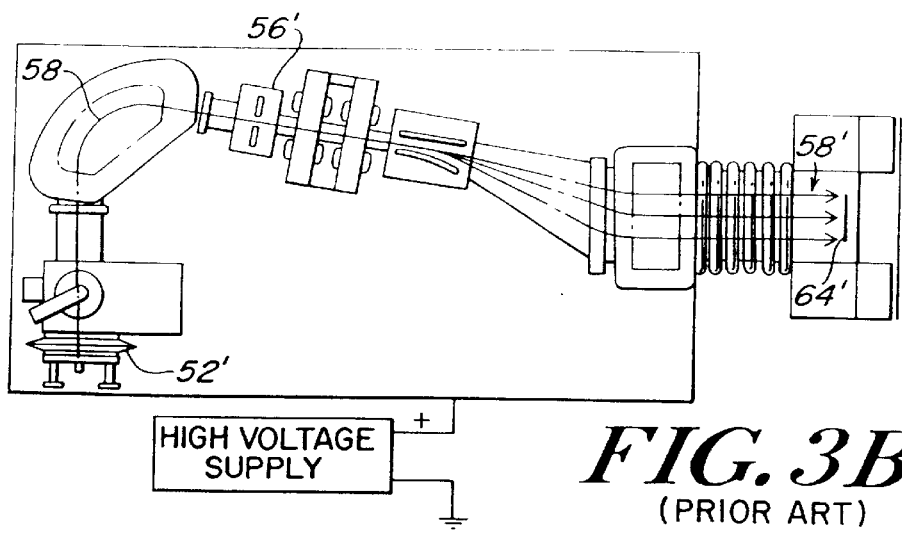
Figure 3C:
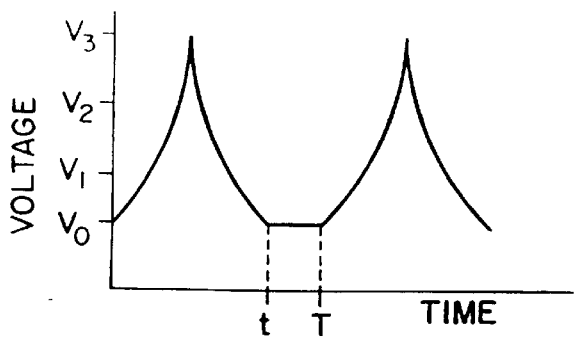

This invention relates to one-dimensional magnetic scanning or switching of a charged particle beam. The invention can be extended to two dimensions at the cost of added complexity. The distinctions between scanning and switching are that a scanned beam is used while its position is changing, whereas a switched beam is used while its position is stationary, and in a scanning application, a single beam species is usually used, whereas in some switching applications it is desired to switch between different beam species, for example between different isotopes in a mass spectrometer. For a scanned beam the velocity with which the beam is translated is critical, whereas for a switched beam it is the accuracy and stability with which position can be maintained between changes in position that is important. The apparatus is essentially the same in each case, and only the waveform is different.

The stored magnetic energy U in any ion beam-deflecting magnet is related to the magnetic rigidity of the ion beam, the cross section of the beam, the scan angle θ, and the length of the magnet as follows:

$$U = \frac{1}{2}\int B.Hdv \approx 2kr^2 l \cdot \frac{2MqV}{\mu_v q^2} \frac{\vartheta^2}{l^2} = \frac{4kMVr\vartheta^2}{\mu_0 q l} \quad \text{(equation 1)}$$

where M is the highest ion mass, qV its highest ion energy, q the charge of the ions, r the radius of the ion beam (including clearance for vacuum chamber walls, etc), $\mu_0$ the permittivity of vacuum, l the length of the scanner magnet, and k is a numerical factor from the integration covering fringe fields, whose value is 2 to 2.5. This relationship assumes the scan angle is small, and that l<r/θ but reveals the scaling law. The stored energy is related to the inductance, and to the reactive power required to scan the beam. If the scanning current waveform is an approximately triangular function of time, the reactive power required must exceed four times (4×) the peak-stored energy in the magnetic field. The stored energy may be 100 Joules in a compact system. At a frequency of 100 Hz this means a power of 40 kVA; at 2.5 kHz it means 1 MVA.

Typically, ion beam switching or scanning magnets are placed within a vacuum, since the changing magnetic field is strongly attenuated by metal vacuum walls. Instead the illustrative embodiment of the present invention uses glass, quartz, or other insulating material as a vacuum wall within the poles, along with disks of conductive material grounded through a relatively high resistance to shield the insulating walls from charged particles. The method of construction keeps the magnetic losses low and the construction inexpensive. The innovation here is laminated beam baffles. In addition, a low inductance is desired, which is proportional to the square of the peak flux, while beam deflection is proportional only to the flux. Hence, a low flux density is economic. The construction of the magnet is optimized if laminated steel separated by laminated dielectric sheets are used. For a field of 0.3 Tesla, 0.014" laminations of steel separated by 0.040" of dielectric may be used.

The power supply must deliver a voltage V=LdI/dt+IR. The reactive power requirement may be many tens of kVA. We address only those applications where dI/dt varies by only a few percent from a nominal value, or else is zero within a few percent. Under these conditions we can separate the power supplies required to meet the real (V=IR) and reactive (V+LdI/dt) parts of the load voltage requirement. The real part is supplied by a power amplifier. The reactive part is provided by a capacitor charged to the required voltage (V=|dI/dt|) which is either disconnected from the load or connected in either polarity in series with the load by a commutator. It may be necessary to provide a low-power high voltage supply to maintain the correct charge on this capacitor, as discussed in detail below.

Figure 4:
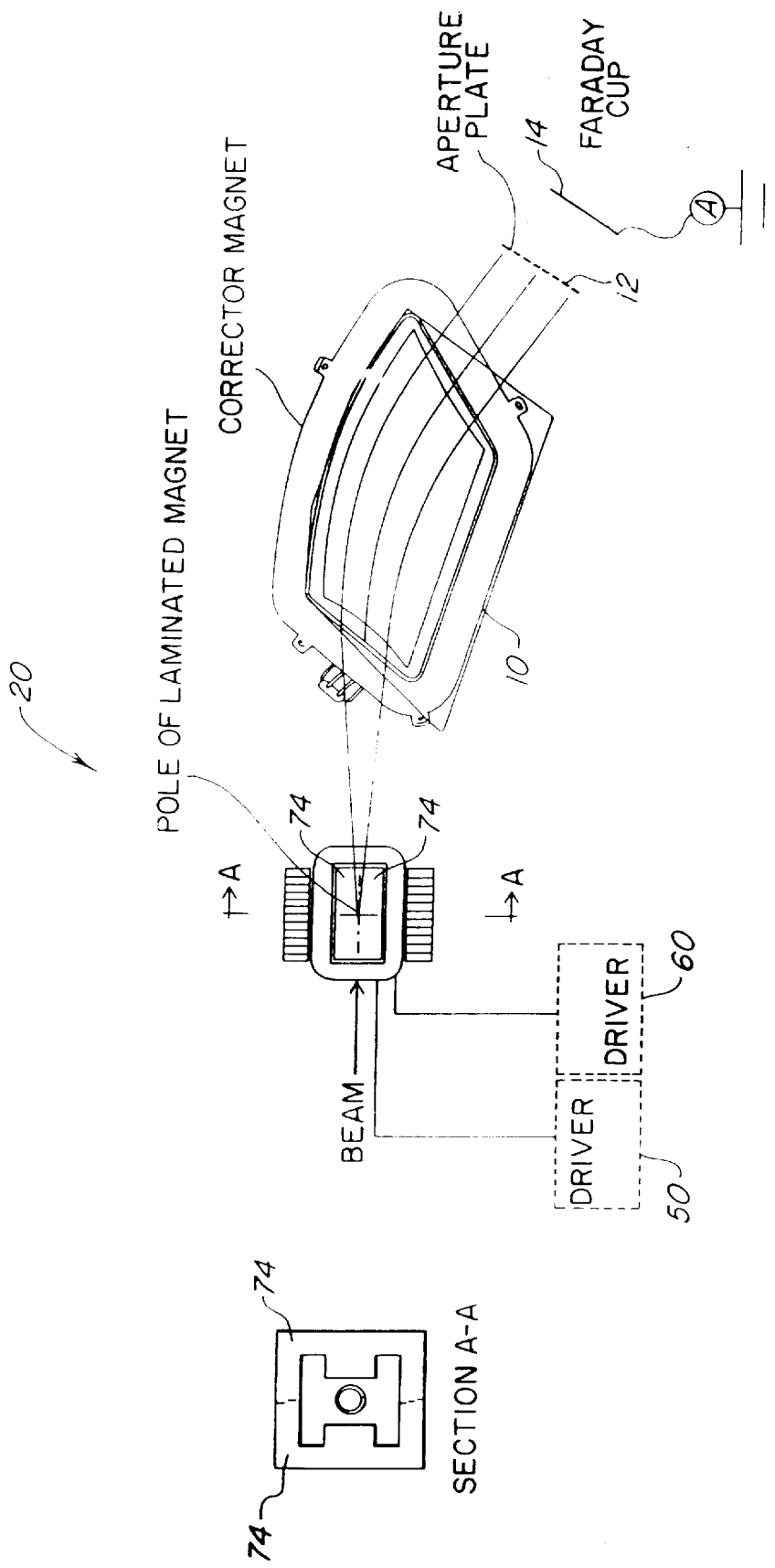
FIG. 4 illustrates an exemplary scanned implanter of an illustrative embodiment of the present invention.
Figure 5:
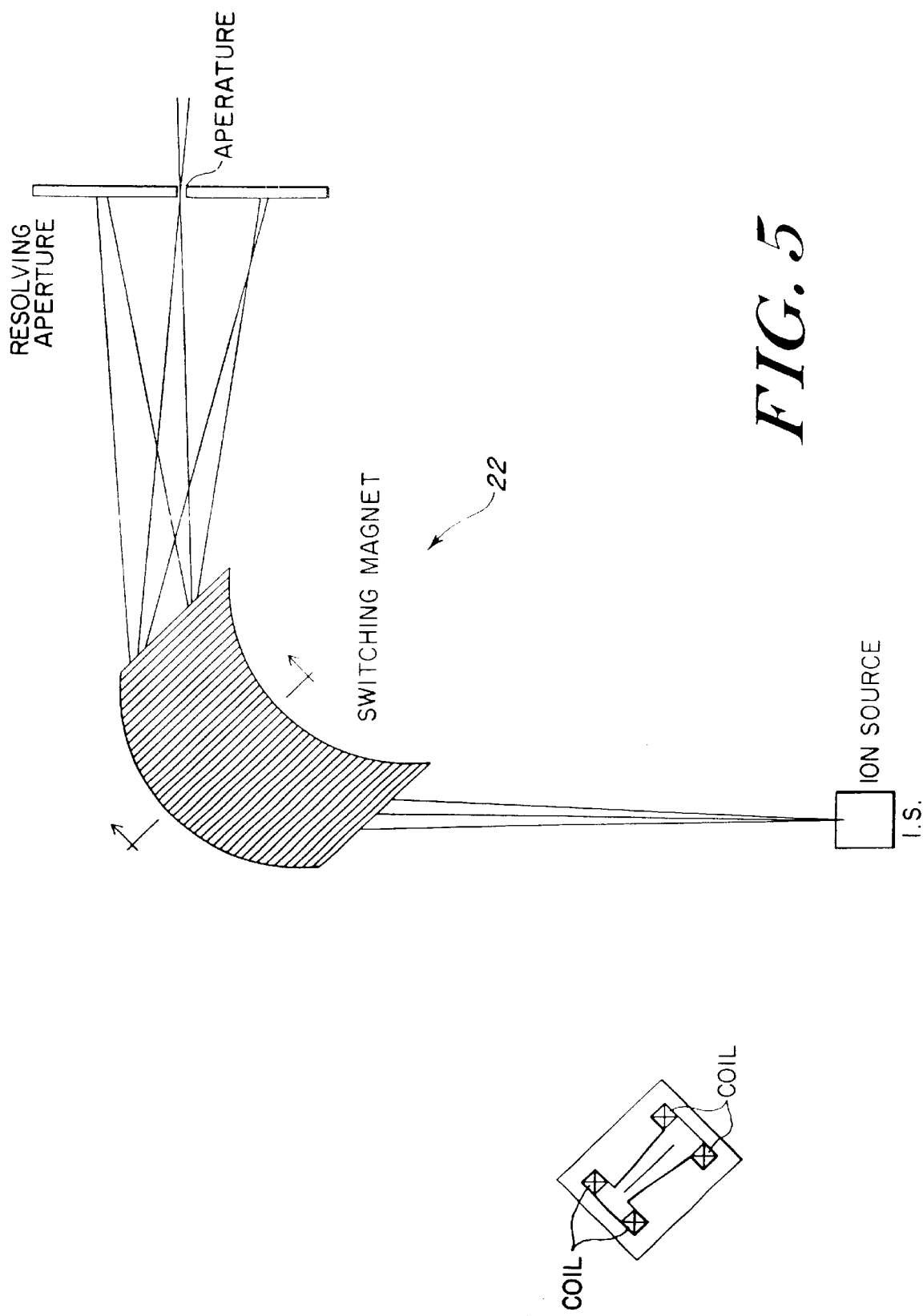
FIG. 5 illustrates an exemplary switcher of an illustrative embodiment of the present invention.
Figure 11:
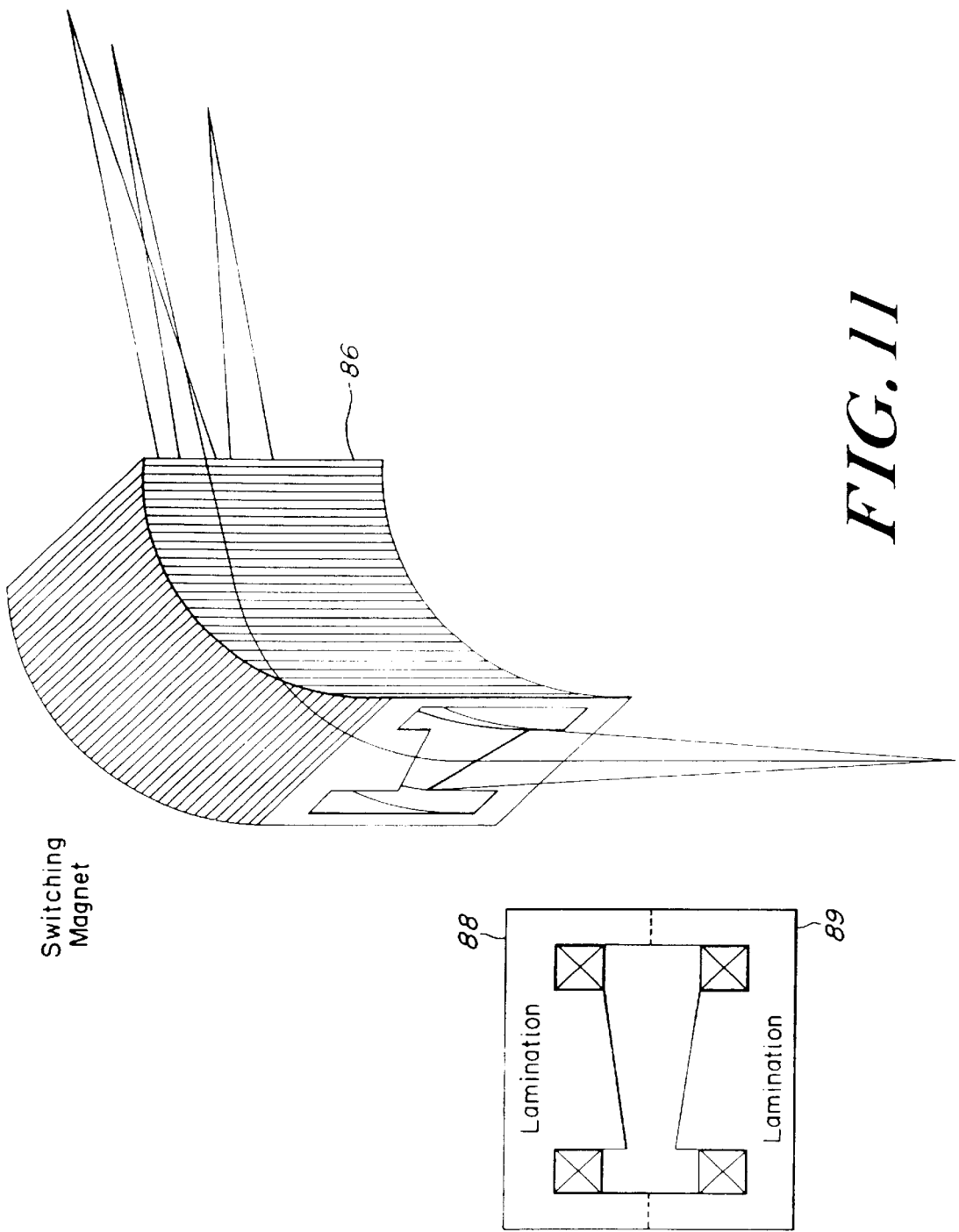
FIG. 11 illustrates an exemplary magnet construction for a switcher of an illustrative embodiment of the present invention.

FIG. 4 illustrates a beam scanning apparatus 20, which happens to be bipolar (since this reduces the total energy), while FIG. 5 illustrates a beam switching apparatus 22, which is monopolar. The beam switching apparatus 22 is illustrated in FIG. 11 in more detail. The corrector magnet 10 depicted in FIG. 4 can be shaped to control the relationship between deflection angle in a scanner magnet and beam position in an object plane, such as an implant location. It is possible to simultaneously correct the trajectories to be parallel and to achieve a linear relationship between scan angle and position. However, it is often necessary to minimize the need for a non-linear scan waveform by the correct design of the shape of the corrector magnet 10, but nonetheless to retain the capability of programming the scanner with a non-linear waveform so that correction of residual errors or unforeseen systematic errors is possible. For more detail involving the operation and construction of the corrector magnet 10 we hereby incorporate by reference U.S. Pat. No. 5,834,786 of White et al. and U.S. Pat. No. 5,350,926 of White et al.

The scanning waveform is generated by a computer or sequencer through a digital-to-analog converter (DAC). The scanning waveform is related to the desired position of the beam as a function of time at a reference plane. Historically, in dosing applications, the average current at different locations has been measured, and the scan waveform his been iteratively corrected until this is uniform. Advantageously, the illustrative embodiment of the present invention provides a direct method of setting up the desired waveform, which is described below in more detail. First, we note that the relationship between deflection angle and beam position will not be perfectly linear. If no optics intervene between scanner and reference plane, then the beam position is related to tan θ, where θ is the deflection angle. Then we note that the deflection angle may not be perfectly linearly related to the field in the magnet. Finally we note that the placement of a "corrector" magnet 10, or other optics (not shown) between the scanner and the reference plane will tend to introduce even-ordered aberrations. In summary the relationship between beam position, x, in the reference plane and the current, I, in the scanner is of the form $$I = a_{98} + a_1 x + a_2 x^2 + a_3 x^3 + a_4 x^4 + a_5 x^5 + \quad \text{(equation 2)}$$

where at least the coefficients through third-order should be non-zero.

Note that the dose rate from a scanned beam is inversely proportional to dx/dt, hence to first-order is proportional to V/L, and that it is imperative that V be almost constant and smoothly varying during periods when uniform doping is desired. The commutator must not switch until the beam is scanned beyond the implanted target.

As FIG. 4 illustrates, an aperture plate 12 is placed in the path of the beam at the reference plane. Apertures are placed at known values of x. The scanner power supply is operated to determine the current I required to place the beam centroid over each of the apertures, by maximizing the transmitted current. This can be done using a scanned beam and fast automated data acquisition, or a dc beam and manual data acquisition. Provided the number of apertures equals or exceeds the number of coefficients to be determined, we can solve the equation for the coefficients. If we desire that the scan position varies uniformly in time, we can create a table of scan digital to analog converter (DAC) values at uniform increments in x by substituting in equation 2. The magnet is then scanned by sequentially sending each value in the table to the DAC at equal time intervals. If it is desired that the relationship between x and time is other than linear, we simply substitute the desired x-position at each linear time increment into equation 2 to calculate the DAC values. The required non-linear scan profile with then be generated. To generate a quasi-triangular waveform, the values in the scan table are programmed sequentially, and on reaching the end point, the sequence is reversed.

In the implant plane, an aperture plate 12 can be placed in the path of the beam. The aperture plate 50 has a hole at a reference position at its center, and additional holes at 25.0 mm increments on either side, in the scanning direction. Behind its aperture plate 12 is a Faraday cup 14, which is sized to accept 100% of the beam that is scanned with a +/−110 mm path.

In operation, an ion beam is passed through the system 20 with the scanner magnet 74 programmed to zero, and the corrector magnet 10 is adjusted from zero until the beam is centered on the central aperture, as determined by maximizing the beam current on the fifth major peak encountered (the others having been caused by the beam traversing the first four holes). If the scanner magnet 74 is now energized by programming triangular waveform (whose amplitude in amps can be estimated from the setting of the corrector magnet in direct proportion), there is a brief period during which the capacitor 36 of the driver circuit 50 which is discussed below in more detail, charges to a quiescent value, after which the beam is stably scanned across all nine apertures in the aperture plate 12. The capacitor 36 may charge to a voltage, which is either too high or too low, if the phase relationship is incorrect. The "correct" voltage is one that causes the excursion of the amplifier 40 to be minimized, and it is therefore possible to create an error signal based upon the average amplifier voltage or to current or both which are used to adjust the phase of the commutator 36, either as a dynamic readback adjustment or as a preset adjustment. A shift of 1 degree in phase can be sufficient to prevent correct operation of the driver circuit 50.

It is necessary to measure the exact programming voltage $V_{prog}$ to the scanner power supply associated with maximum transmission through each of the nine apertures in the aperture plate 12. This measurement must be performed to a precision of about 0.1 amps, and can be accomplished automatically as the beam is scanned, or manually using a dc current to the scanner magnet 74.

TABLE 1

| Known position | $V_{prog}$ | t mS |
|---|---|---|
| −125 mm | 4.976 | 0.00 |
| −100 mm | 3.997 | 1.00 |
| −75 mm | 3.102 | 2.00 |
| −50 mm | 2.035 | 3.00 |
| −25 mm | 1.012 | 4.00 |
| 0 mm | 0.010 | 5.00 |
| 25 mm | −.997 | 6.00 |
| 50 mm | −1.995 | 7.00 |
| 75 mm | −2.982 | 8.00 |
| 100 mm | −3.971 | 9.00 |
| 125 mm | −4.973 | 10.00 |

As the illustrative table 1 indicates, one beam pass is designed to occupy 10 mS. The return pass would be a reverse of the table. The scanning frequency would thus be 50 Hz, and the total scan amplitude 250 mm, which would cleanly scan a beam of up to 50 mm diameter off the edge of a 200 mm wafer. The actual table used to drive a DAC to drive the scanner requires many more points. If the sampling frequency is 20 kHz, for example, the table requires 201 points. These points must lie along a smoothly varying curve, and linear interpolation of the points in the measured table is insufficiently smooth, so the data should be fitted to a polynomial:

$$V_{prog}=a_0+a_1 t+a_2 t^2+a_3 t^3+ \qquad \text{(equation 3)}$$

from which the full table can be evaluated by substitution.

Once the table is generated, the scan waveform is programmed by indexing up and down the table in equal time increments of 100 microseconds, and programming the scan amplifier 40 with the resulting values of $V_{prog}$. Implants are performed by traversing wafers at uniform velocity through the scanned beam. Typically five terms retained in equation 3 should be sufficient to cover known aberrations of sufficient magnitude to adversely affect the uniformity of the dose rate achieved by the scan system although fewer terms or additional terms can be utilized. To provide smooth scanning, a much larger table with finer time increments can be created. In practice a table of up to 500 points at time increments of 20 microseconds is considered sufficient. The waveform can be modified slightly at the turning points to splice in a smooth curve. This results in a waveform which can be followed with greater fidelity.

Figure 6A:
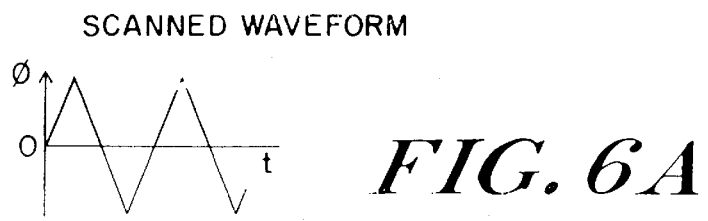
FIG. 6a illustrates an exemplary scanning waveform of an illustrative embodiment of the present invention.
Figure 6B:
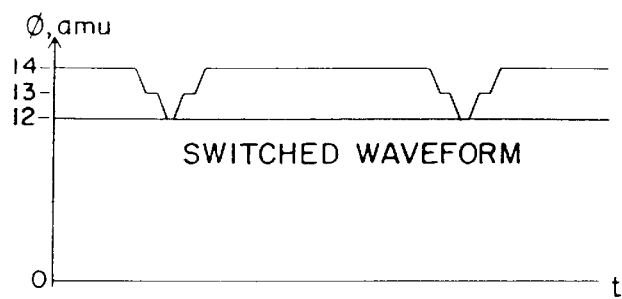
FIG. 6b illustrates an exemplary switching waveform of an illustrative embodiment of the present invention.

For most applications, it is desired to hold the scanner current at a constant value for part of the time. This may be at asynchronous or synchronous moments. For example, in isotope switching applications, the desired scanned waveform can be as shown in FIG. 6a, whereas in ion implantation applications such as those described in U.S. Pat. No. 4,922,106, the desired switched waveform can be as shown in FIG. 6b. When the slew rate is desired to be high, the capacitor 36 of the driver circuit 50 or 60, which are described below in more detail, is switched in series with the scan amplifier 40 in the appropriate polarity. When it is desired to be low or zero, the capacitor is switched out and the terminals shorted (S1 and S2 both in position A). In this mode, the "DC" mode, the magnet current can be changed slowly to any desired value.

Figure 8A:
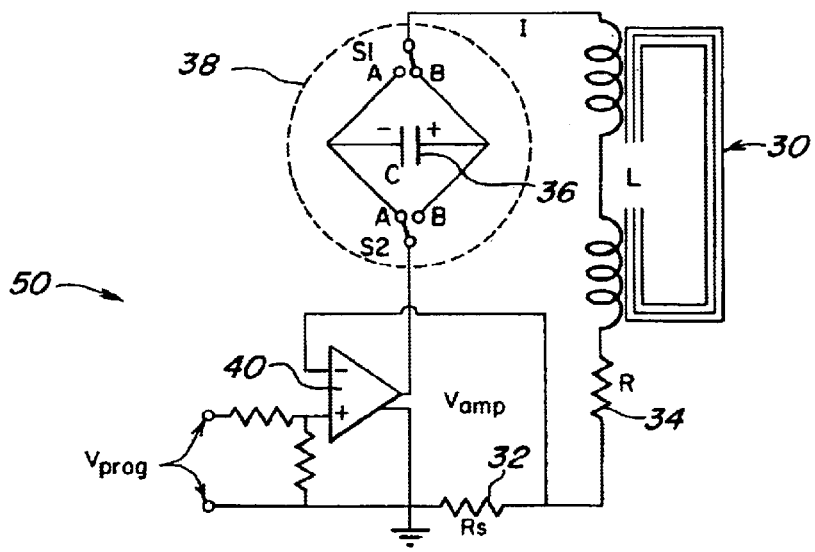
FIG. 8a illustrates a first exemplary circuit of an illustrative embodiment of the present invention.

The driver circuit 50 illustrated in FIG. 8a operates in the following manner. The inductance L is the scanner magnet 30. The losses of the scanner magnet 30 are lumped with all other losses, including the sense resistor 32 ($R_s$), into a resistor 34 (R). If the laminated magnet is well-designed, most of the losses are ohmic, so R is a close representation of the DC resistance of the circuit. The amplifier 40 has an output $V_{amp}$, which has a maximum value $V_{max}$ and minimum value $V_{min}$. The storage capacitor 36 in the commutator 38 has a capacitance C that should exceed $L/f^2$, where f is the operating frequency. The amplifier 40 delivers a current I proportional to a programming signal $V_{prog}$ unless there is insufficient voltage drive to overcome the reactance of the scanner magnet 30. To compensate for non-linearity in the behavior of the laminated steel core, i.e. between the current I and the total flux, Φ, a sense coil (not shown) could be wound on the inductor, and its output could be integrated and combined with the signal from the dc current sense resistor 32 for use as a feedback signal in the amplifier 40. In this manner, the amplifier 40 operates to control the rate of change of flux in the scanner magnet 30. However, the amplifier 40 is incapable of producing a sufficient output voltage to support the required dI/dt, as discussed above without going into saturation.

The commutator 38 has three states, characterized by the symbol $K_{com}$, which can take the value +1, 0 or −1. K=+1 represents the state where switch S1 is in position B, and switch S2 is in position A. K=0 represents the state where S1 and S2 are both in position A. K=−1 represents the state where S1 is in position A and S2 is in position B. The switches may be solid-state half-bridge elements utilizing insulated gate bipolar transistors (IGBT). The switches S1 and S2 need to be break-before-make switches with overvoltage protection and freewheeling bypass diodes that operate in a time interval of a few microseconds maximum. Typically, switches S1 and S2 are configured to be a pair of IGBT's or alternatively a pair of field effect transistors (FET). The electromagnetic field (EMF), E, in the driver circuit 50, is the algebraic sum of $K_{com}*Q*C-IR+V_{amp}$, and this can be equated to LdI/dt.

The programming signal for the current is electronically differentiated to give a signal $V_{diff}$. Assuming $V_{diff}$ to run from −5 to +5V, the commutation signal can be generated from it by defining: K=+1 for $V_{diff}>0.5V$, K=0 for $-0.5<V_{diff}<0.5V$, and K=−1 for $V_{diff}<-0.5V$. This satisfactory provides $V_{max}>0.1*L*(dI/dt)_{max}$ in a system where the expected range of amplitude does not exceed a factor of ~5. The phase of the signal so derived needs to have a provision for fine adjustment by +/−1 degree in order to ensure that the net current to the capacitor C is zero on average when it has the optimum voltage.

Figure 9A:
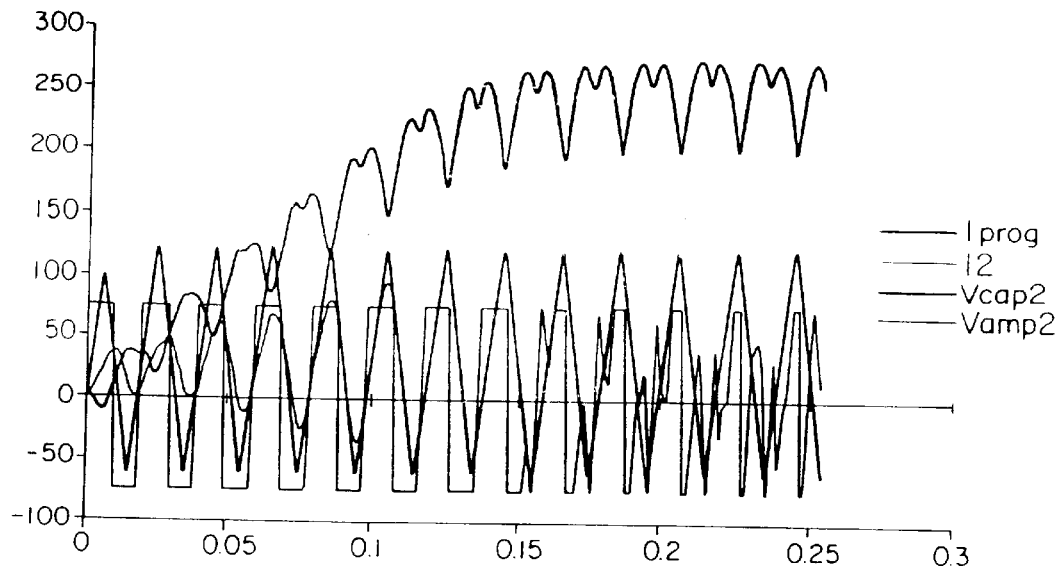
FIG. 9a illustrates an exemplary charging waveform and a steady state waveform of an illustrative embodiment of the present invention.

FIG. 9a graphically depicts the results when the driver circuit 50 is started from a state where all voltages and currents are zero. With a frequency of about 50 Hz, the waveform, a pure triangular wave, the inductance is 16 mH, the capacitance is 5,000 μF, and $V_{max}$ is 75V. For the first eight cycles the output current is way below the desired value, and the amplifier 40 saturates while trying to deliver the required voltage. But in the process, charge is injected into the capacitor 38, whose voltage increases so that by the end of the $10^{th}$ cycle the amplifier 40 is substantially out of saturation and the error in current is small, recovering to be within 0.5% of the setpoint for 90% of the cycle.

If the amplitude of the programming signal, or more particularly the value of dI/dt, should be reduced, a lower voltage is required on the capacitor 36 and the driver circuit 50 functions in an analogous fashion to reduce the voltage over ten or so cycles. The energy must be given up to the amplifier 40, which must be provided with energy-absorbing capabilities. For various reasons, this is likely to be a switching pulse width modulation (PWM) amplifier such as those manufactured for driving large DC motors, and having a useful bandwidth above 1 kHz. Typically, these amplifiers are efficient, and have suitable energy-shedding capabilities. Reactive power levels are tens of kVA.

When the apparatus is used to uniformly scan a beam across a workpiece in order to dope it, a more-or-less triangular wave is used. Commutation occurs at the turning points, but not while the beam is traversing the region where doping is to be uniform. Again, note that the dose rate from a scanned beam is inversely proportional to dx/dt, hence to first-order is inversely proportional to V/L, and that it is imperative that V be almost constant and smoothly varying during periods when uniform doping is desired. Note, however, that if the amplifier 40 is a pulse width modulated amplifier, or under other circumstances described blow, there may be switching noise superimposed on this waveform, requiring a high-order filter to be used to smooth V before judging its shape.

The average voltage on the capacitor 36 remains constant at a desired value if the average current is zero. Because of the use of the commutator 38 this condition is not necessarily met if the average current in the inductor is zero. Also, it is possible to meet this condition even when the average current in the inductor is non-zero. This is determined by the timing of the commutation with respect to the state of the amplifier 46, and the precise timing with respect to the turning points when dI/dt reverses has a large effect on whether the capacitor 36 receives a net charging current or a net discharging current.

It will be appreciated that the amplifier 40 must supply the power dissipated in the ohmic and other losses in the system. An alternative approach, dispenses with the amplifier 40 and utilizes a higher voltage DC power supply of equivalent power rating, which maintains the charge on the capacitor 36 directly.

In this alternative approach, the DC voltage exceeds the highest voltage required to achieve the desired rate of current change. Since there is now no low-voltage amplifier 40 to correct errors in the current waveform, errors in its current waveform must be corrected in an alternative manner. The commutator 38 can be operated in a pulse-width-modulated mode at a high frequency, typically in the range of 10 to 30 kHz. Such systems are commercially available, and use a pulse-width-modulated amplifier switching at 20 kHz. A suitable system is manufactured by Glentek Incorporated of El Segundo, Calif. However, since these systems are primarily designed to deliver large amounts of real power to electric motors, they are not optimized for this application. One of the limitations of such a system is that the bandwidth is automatically limited. Under the Nyquist theorem, the bandwidth of a 20 kHz pwm amplifier cannot exceed 10 kHz. In practice it is limited to about 5 kHz by stability criteria. This limits the fidelity with which a 100 Hz waveform can be followed. A second limitation is that as the varying load current transitions through zero, the emf driving dI/dt falls by the forward voltage drop in the IGBTs that are performing the pwm switching. As a result, dI/dt also undergoes a change. The feedback loop controlling the pulse width modulator cannot respond within 200 microseconds, as mentioned above, resulting in a significant and asymmetric crossover distortion.

Figure 8B:
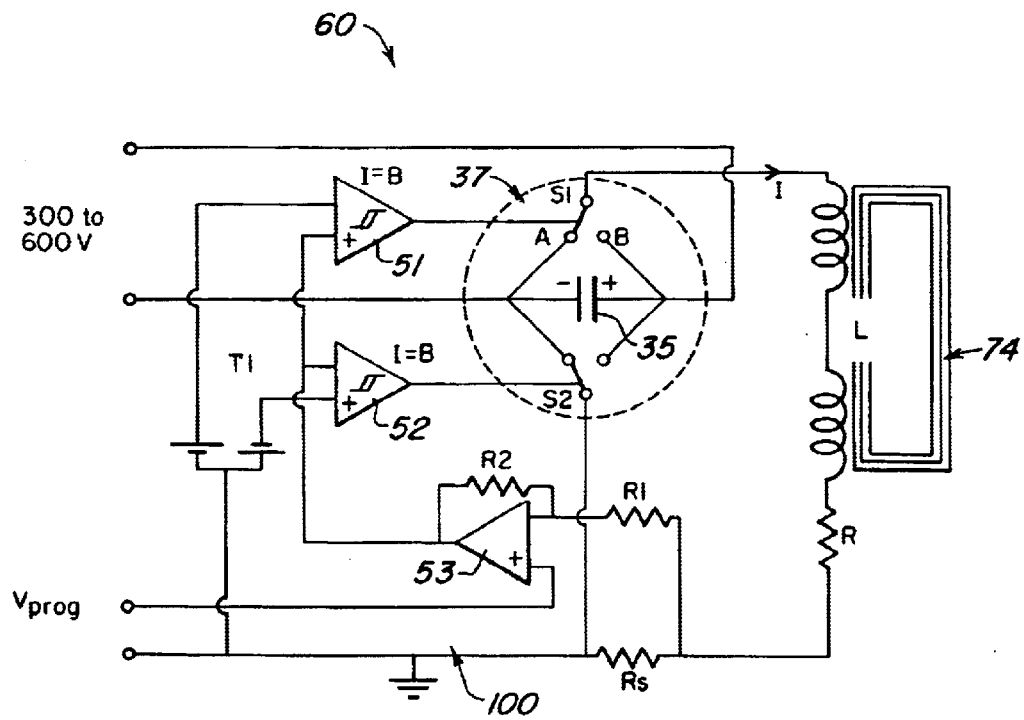
FIG. 8b illustrates a second exemplary circuit of an illustrative embodiment of the present invention.

As FIG. 8b illustrates, the system need not operate at a fixed switching frequency. Instead, when the error between the desired and the actual current in the inductive load exceeds a certain threshold, the commutator 37 is switched on in the appropriate direction for an undetermined amount of time until the error is reduced below a lower threshold, such as zero. The error signal described above is used to switch the commutator 38 into the $K_{com}$=+1, 0 or −1 modes in such a manner as to reduce the error, whenever the error exceeds a certain preset threshold. Referring to FIG. 8b, comparators 51 and 52 will change their output to a logic "1" level if the positive input value exceeds the negative input value by an amount DV, and will change from a logic "1" level to a logic "0" level if the negative input value exceeds the positive input value by an amount DV. Thus comparators 51 and 52 each have a total hysteresis of 2DV. Threshold T1 may be set to −DV, and threshold T2 may be set to +DV. The circuit 60 functions in the following manner. If the coil current through the coil 62 is less the desired value, the error signal from the current comparator 53 will be positive with respect to the ground mode 100. The ratio of the error signal to the error in coil current is determined by the values of resistors Rs, R1 and R2. If the error signal is positive by more than an amount 2DV, then comparator 51 switches the commutator 37 into state $K_{com}=+1$, by placing switch S1 in state B. This applies the voltage across capacitor 35 so as to increase the current in the coil L in the positive direction. When the error falls to zero, the commutator 37 is again placed in state 0 by returning S1 to A.

Conversely, if the error signal from the current comparator 53 falls below the threshold T2, comparator 52 places switch S2 in state B, which places the commutator 37 instate $K_{com}=-1$, which tends to drive the current negative, again until the error is reduced in magnitude to zero. One skilled in the art will recognize that additional components may be added to ensure clean switching without oscillation, and that the selection of thresholds may be slightly different in each application. In this mode the frequency of switching is proportional to a) the error between the desired dI/dt and the instantaneous value obtained when the commutator 37 is conducting, and b) the reciprocal of the hysteresis in comparators 51 and 52. Nevertheless, those of ordinary skill in the art will recognize that issues of isolation and grounding need to be on a per application basis. To illustrate the above described operation, if DV=0.5V, Rs=0.01 ohms, and the desired current varies from +100A to −100A at frequencies between 10 and 100 Hz, with a required precision of +/−0.1A, then comparator 53 requires a gain of ~1000, which can be achieved by setting R1=100 ohms, and R2=100 kohms. The gain of the comparator 53 can be such that the maximum tolerable error in current generates an error signal of magnitude 0.5V at the output of the comparator 53. The highest switching frequency is estimated to be 100/0.1*100 Hz=100 kHz. However, the switching frequency is much lower if the waveform frequency or the peak current is reduced.

Figure 9B:
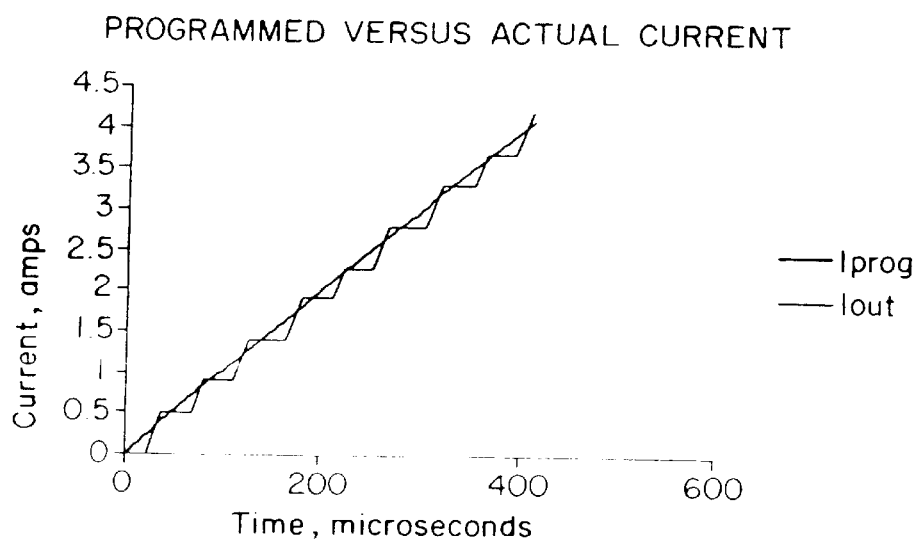
FIG. 9b illustrates exemplary waveforms for an additional illustrative embodiment of the present invention.

Typically, the commercially available pwm amplifier is limited to a frequency response of ~5 kHz by the combination of the Nyquist criterion and feedback loop stability, whereas the circuit 60 responds in a time interval on the order of five microseconds, which happen to be the minimum on and off times of the commutator switches 51 and 52. Under normal conditions, the circuit 60 switches at a far lower frequency because dI/dt is lower. However, the maximum error in I would not be exceeded. Furthermore there is no clock frequency, so no possibility of beat frequencies or alias frequencies can cause unexpected variations in dI/dt exists. A further refinement of the circuit 60 is to adjust the magnitude of both the hysteresis and the voltage on the capacitor 36 downward when the waveform frequency is reduced, so as to keep the commutation frequency relatively high and improve the fidelity of the output current waveform. FIG. 9b graphically illustrates a comparison of the desired and resultant waveforms from the driver circuit 60. Preferred Embodiment 1 for an Ion Implanter.

Figure 7:
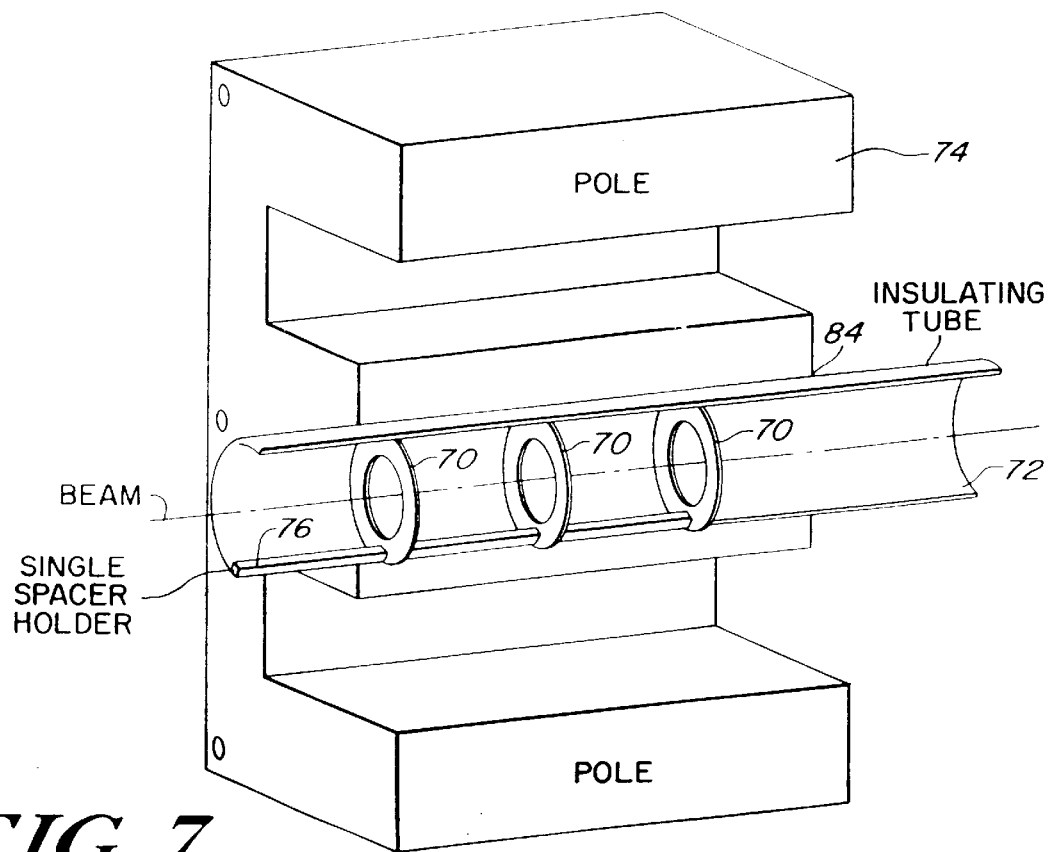
FIG. 7 illustrates an exemplary tube with apertures of an illustrative embodiment of the present invention.

The following description is for equipment capable of scanning a 1 MeV$^{123}$Sb$^+$ beam across a 200 mm wafer, or any other beam of similar or lower magnetic rigidity. The beam is assumed to have a radius of 22 mm at the scanner magnet 74. As FIG. 7 illustrates, a set of annular disks 70 of tantalum surround the beam as it passes through a quartz tube 72 through the scanner magnet 74. The annular disks 70 prevent the beam from striking the interior walls of the quartz tube 72, thereby preventing forward sputtering by the ion beam of contaminants, and they provide a reference potential in spite of the presence of quartz walls. The annular disks 70 are connected as shown in FIG. 7 to prevent the creation of conductive loops, which would dissipate power as a result of the changing magnetic flux. The overall radius of the quartz tube 72 is about 35 mm. The scan angle desired is +/−2.5 degrees. Substituting these values into equation 1 gives a stored energy of 45 J multiplied by a geometry factor k. Detailed modeling has shown that k has a value in this instance of approximately 2, and the stored energy is −85J.

Figure 10:
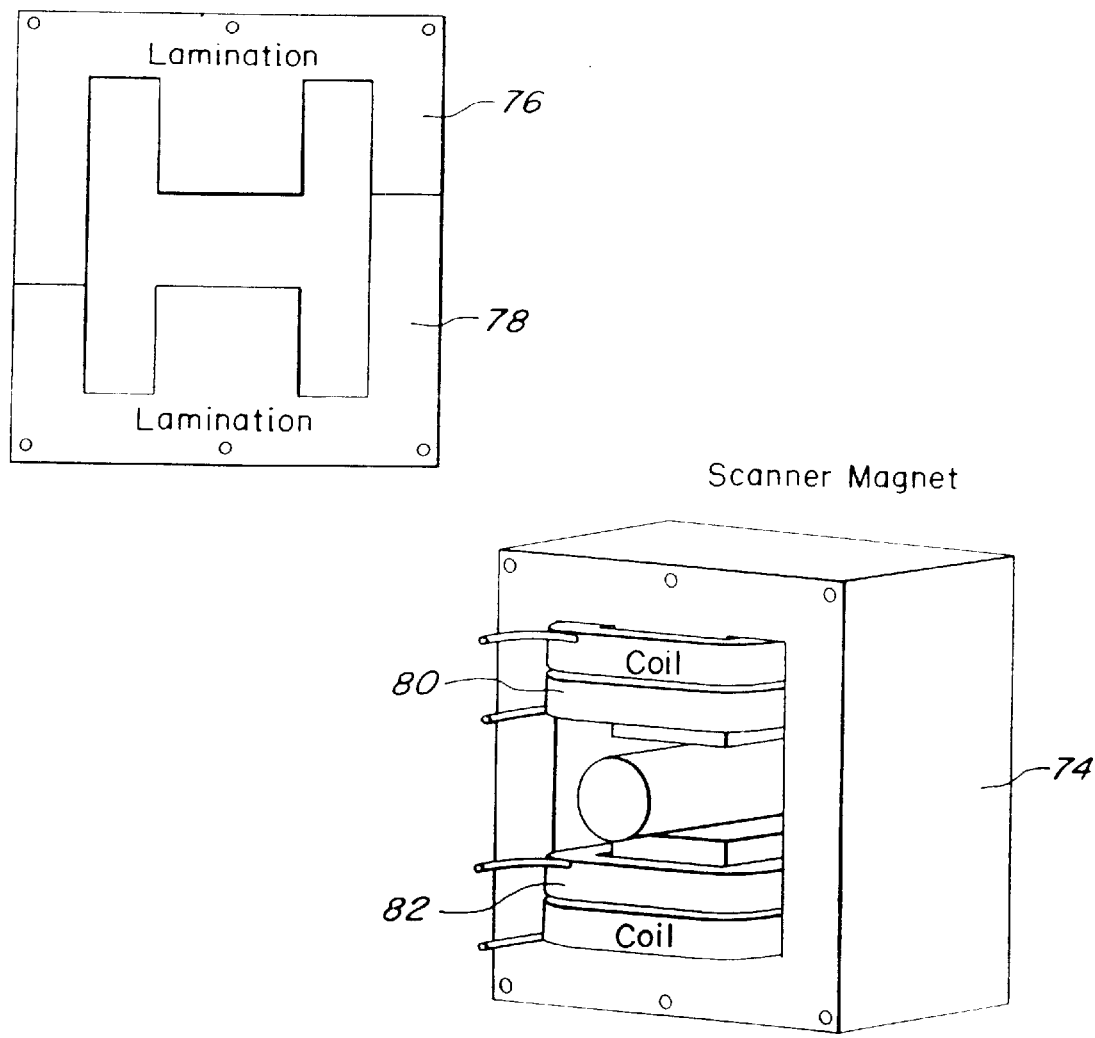
FIG. 10 illustrates an exemplary magnet construction for a scanner of an illustrative embodiment of the present invention.

The scanner magnet 74 is constructed from a stack of 8" thick E-shaped transformer laminations 76 and 78, each 0.014" thick, from which a piece has been cut. The laminations 76 and 78 are 12"×8" with 2" slots for the coil windings 80 and 82. FIG. 10 illustrates a cross-section of the scanner magnet 74. The pole gap 84 is about 70 mm. The two coil windings 80 and 82 each consist of about seventy turns of square #4 wire. The coil windings 80 and 82 are water-cooled by means of a non-shorted 3/16" diameter copper tube passing cooling water that art built into the coil structure. Inductance is 16 mH and the operating maximum current is about over 100A.

The power amplifier 40 consists of a bipolar amplifier sold commercially for the purpose of driving a dc electric motor, and rated at up to +/−75V and 100A. The capacitor 36 is switched by commercial half-bridge IGBT-based switches, with logic to prevent short-circuiting. The capacitor can charge to ~400V during operation. Overvoltage protection is provided built-in reverse-voltage clamps that keep the maximum IGBT voltage a few volts over the capacitor voltage by virtue of the bridge connections.

Scan correction is accomplished by a 35 degree 1T magnet with entrance and exit pole angles of 40 and −23 degrees, optimized by the computer programs TRANSPORT and TOSCA. The following coordinate definitions, typical of such applications, are used: x, y and z are beam-centered curvilinear coordinates, where the beam is traveling in the positive z-direction. The magnets deflect the beam in the x–z plane, i.e. the dominant magnetic field component is in the y-direction (positive or negative). The angles x' and y' are angles to the reference trajectory in the x–z and y–z planes. The scanner varies x' between −2.5 and +2.5 degrees. The suffixes 1 and 2 refer to input and output conditions, specifically to the centroid of the scanner field and the implant location respectively. The first-order condition is that $x'_2/x'_1=0$, for a parallel scanned output beam. The $x'_2/x'_1{}^2$ aberration has been reduced to an insignificant level to control scan linearity, and the coefficients $x'_2/x'_1{}^2$ and $x'_2/y'_1{}^2$ have been reduced to a sufficiently low level to keep the parallelism of the beam within +/−0.5 degrees. These refinements are accomplished by means of the curvatures of the entrance and exit pole faces, and by controlling the non-uniformity of the field, as is well known to practitioners of the art.

In the implant plane, an aperture 50 can be placed in the path of the beam. It has a hole at a reference position at its center, and additional holes at 25.0 mm increments on either side, in the scanning direction. Behind this aperture array is a Faraday cup which is sized to accept 100% of the beam which is scanned with a +/−110 mm path.

The ion beam is passed through the system with the scanning magnet programmed to zero, and the corrector magnet is adjusted from zero until the beam is centered on the central aperture, as determined by maximizing the beam current on the fifth major peak encountered (the others having been caused by the beam traversing the first four holes). If the scanner is now energized by programming triangular waveform (whose amplitude in amps can be estimated from the setting of the corrector magnet in direct proportion), there will be a brief period during which the capacitor charges to a quiescent value, after which the beam is stable scanned across all nine apertures in the plate. The capacitor may charge to a voltage which is either too high or too low if the phase relationship is incorrect. The "correct" voltage is one which causes the excursion of the amplifier to be minimized, and it is therefore possible to create an error signal based upon the average amplifier voltage and/or current which is used to adjust the phase of the commutation, either as a dynamic readback adjustment or as a preset adjustment. A shift of 1 degree in phase can be sufficient to prevent correct operation of the circuit.

It is necessary to measure the exact programming voltage $V_{prog}$ to the scanner power supply associated with maximum transmission through each of the nine apertures in the plate. This measurement must be performed to a precision of <∼0.1 amp, and can be accomplished automatically as the beam is scanned, or manually using a dc current to the scan magnet. A table, of which the following is illustrative is constructed:

TABLE 2

| Known position | $V_{prog}$ | t mS |
|---|---|---|
| −125 mm | 4.976 | 0.00 |
| −100 mm | 3.997 | 1.00 |
| −75 mm | 3.102 | 2.00 |
| −50 mm | 2.035 | 3.00 |
| −25 mm | 1.012 | 4.00 |
| 0 mm | 0.010 | 5.00 |
| 25 mm | −.997 | 6.00 |
| 50 mm | −1.995 | 7.00 |
| 75 mm | −2.982 | 8.00 |
| 100 mm | −3.971 | 9.00 |
| 125 mm | −4.973 | 10.00 |

According to Table 2, one beam pass is designed to occupy 10 mS. The return pass would be a reverse of the table. The scanning frequency would thus be 50 Hz, and the total scan amplitude 250 mm, which would cleanly scan a beam of up to 50 mm diameter off the edge of a 200 mm wafer. The actual table used to drive a DAC to drive the scanner requires many more points. If the sampling frequency is 20 kHz, for example, the table requires 201 points. These points must lie along a smoothly varying curve, and linear interpolation of the points in the measured table is insufficiently smooth, so the data should be fitted to a polynomial:

$$V_{prog}=a_0+a_1t+a_2t^2+a_3t^3+\ \ \ \ \ \ \ \text{(equation 3)}$$

from which the full table can be evaluated by substitution.

Once the full table is generated, the scan waveform is programmed by indexing up and down the table in equal time increments of 100 microseconds, and programming the scan amplifier with the resulting values of $V_{prog}$. Implants are performed by traversing wafers at uniform velocity through the scanned beam. Experience should determine the number of terms to be retained in equation 3, but 5 terms should be sufficient to cover known aberrations of sufficient magnitude to adversely affect the uniformity of the dose rate achieved by the scan system. To provide smooth scanning, a much larger table with finer time increments can be created. We have used a table of 500 points at time increments of 20 microseconds. The waveform can be modified slightly at the turning points to splice in a smooth curve. This results in a waveform which can be followed with greater fidelity.

The commutator consists of a bridge of four FETs or four IGBTs. In general IGBTs handle higher power levels than FETs; other devices may be substituted as they become available. IGBTs are available in modules of two, in a package which contains the driving logic. Therefore Bridge 30 in FIG. 8a or 8b can comprise two such IGBT packages, one represented by switch S1, and one represented by switch S2. In a practical embodiment, ancillary components such as isolated power supplies, and opto-isolated signals, must be provided. Suitable electronic devices for switching high voltages and currents are constantly being invented, and any new embodiments of the bridge structure shown are intended to fall within the scope of this invention.

Preferred Embodiment 2 for an Ion Implanter

The same beam and scanner apparatus is used as for the first embodiment, but an alternative power supply is used as illustration FIG. 8b. The source of power in this embodiment is a high voltage power supply of 300 to 600V, which need not be well regulated but is attached to a large capacitance of 1000 microfarads. For convenience this is full-wave rectified three-phase power. The combination is placed within the commutator 37. A sense resistor Rs produces a signal proportional to the current in the scanner magnet 74. A comparator 53 compares this current with the desired current programming signal. Those skilled in the art will recognize that the comparison can also be performed in a digital manner. When the error exceeds a threshold for a certain time (e.g. 0.1A for 2 microseconds) one of the commutator switches 51 or 52 is operated so as to apply the voltage on the capacitor 35 to the coil L in the direction which would reduce the error. The commutator 37 is switched off when the error falls below a second threshold for a certain time (e.g. 0.00A for 1 microsecond). There is a defined deadband and a minimum deadtime between changes in state of the commutator 37. The deadband and deadtime are related to the frequency of switching, and also affect the amount of heating of the power devices in the commutator 37. The maximum required frequency is about 100 kHz.

Preferred Embodiment 3 for a Beam Switcher

FIG. 11 illustrates the construction of an illustrative switching magnet 86. Construction of the switching magnet 86 is in the same E-core steel lamination 76 and 78 of the scanner magnet 74, but the center leg is trimmed at a slight angle, to create a slight gradient in the magnetic field. Each lamination 88 and 89 are clamped and glued to lie on an arc whose radius approximates the intended trajectory of a central ion of a selected species, at 300 mm. The switching magnet 86 is designed to bend a selected species through 90 degrees, and to provide simultaneous focussing in x- and y-coordinates, as is inclined at 45 degrees to the beam axis, and this requires a field index n of approximately −0.29, where n is defined to be n=r/B dB/dr, where r=300 mm is the radius of the trajectory, and B is the magnetic field strength seen by the reference trajectory.

In operation, it is desired to switch rapidly between certain magnetic field settings, for example between those for 20 keV beams of $^{12}C^-$, $^{13}C^-$, and $^{14}C^-$, which would require fields of 0.23, 0.24, and 0.250 T respectively. Switching time is typically around 5 msec. Each beam is identically focussed when its respective field is produced. Systematic differences in the ion-optical conditions encountered by each beam consist only of variations in the stability of the field at each value. This depends on timing of the commutation to ensure that the current is within required limits at the moment the capacitor 36 is removed from the circuit 50. That is, the capacitor 36 is in use only during transitions from one deflection to the next. The power amplifier 40 is in this instance a standard commercial programmable DC switching power supply, to which over- and under-voltage protection devices have been added.

Other variants of the invention should be apparent to those skilled in the art. For example, the optics of the magnets may be modified to achieve different beam position/divergence objectives, or obtain the same objectives by other pole profiles than those described herein. The invention may also be applied to higher and lower magnetic rigidity beams, and to applications requiring non-uniform beam scanning patterns, for example spinning disk batch processors.

What is claimed is:

1. An apparatus for generating a repetitive time-varying alternating current waveform to generate a time-varying magnetic field having a peak value in a magnetic core of a magnet, wherein said repetitive time-varying alternating current waveform alternates from a first constant value to a second constant value, the apparatus comprising:

one or more coils coupled around said magnetic core, wherein each of said one or more coils have a first and second terminal for the application of an energizing power;

a power amplifier capable of delivering excess electrical power of a desired polarity to each of said one or more coils to sustain a continuous magnetic field by overcoming ohmic losses in each of said one or more coils, said continuous magnetic field having a value equal to or exceeding the peak value in the desired alternating magnetic field waveform; and a capacitor having a positive and negative terminal which can be connected by switching means in series with said power amplifier and each of said one or more coils, the capacitor being large enough that the reactance of the capacitor is less than the inductive reactance of each of said one or more coils at a required frequency of operation, and the switching means being capable of being operated in three modes, named mode 1, mode 0, mode −1, where mode 1 is to connect the capacitor in series with its positive terminal connected to one terminal of each of said one or more coils and its negative terminal to one terminal of the power amplifier, mode 0 is to connect each of said one or more coils terminal directly to said power amplifier terminal omitting the capacitor, which is left open-circuit, and where mode −1 is to connect the capacitor in series with its negative terminal connected to said terminal of each of said one or more coils and its positive terminal to said terminal of the amplifier.

2. The apparatus of claim 1, wherein said amplifier is programmed by a voltage waveform proportional to the desired current in said coil.

3. The apparatus of claim 1, wherein said amplifier is programmed by a voltage waveform proportional to the desired magnetic flux in said magnetic core.

4. An apparatus for generating a repetitive time-varying alternating current waveform to generate a time-varying magnetic field having a peak value in a magnetic core of a magnet, wherein said repetitive time-varying alternating current waveform alternates from a first constant value to a second constant value, the apparatus comprising:

one or more coils coupled around said magnetic core, wherein each of said one or more coils have a first and second terminal for the application of energizing power;

a power amplifier fed by a voltage waveform, the amplifier capable of delivering electrical power of a desired polarity to each of said one or more coils to sustain a continuous magnetic field by overcoming an ohmic loss in each of said one or more coils, said continuous magnetic field having a value equal to or exceeding the peak value in the desired alternating magnetic field waveform; and a capacitor having a positive and negative terminal which can be coupled by a switch in series with said power amplifier and each of said one or more coils, the capacitor being large enough that the reactance of the capacitor is less than the inductive reactance of each of said one or more coils at a required frequency of operation, and the switch being capable of being operated in three modes.

5. The apparatus of claim 4, wherein the amplifier is fed by a voltage waveform proportional to a desired current in each of the one or more coils.

6. The apparatus of claim 4, wherein the amplifier is fed by a voltage waveform proportional to a desired magnetic flux in said magnetic core.

7. The apparatus of claim 4, wherein the amplifier is fed by a voltage waveform proportional to a desired voltage in each of the one or more coils.

8. The apparatus of claim 4, wherein the amplifier is fed by a voltage waveform proportional to a desired rate of change of flux in said magnetic core.

9. The apparatus of claim 4, wherein the switch switches to a first mode of the three modes if a slope value of the voltage waveform is above a threshold value.

10. The apparatus of claim 4, wherein the switch switches to a second mode of the three modes if a slope value of the voltage waveform is below a threshold value.

11. The apparatus of claim 4, wherein the switch switches to a third mode of the three modes if a slope value of the voltage waveform is at or between a first threshold value and a second threshold value.

12. The apparatus of claim 4, wherein the first of the three modes couples a positive terminal of the capacitor in series with the first terminal of each of said one or more coils and couples a negative terminal of the capacitor to a first terminal of the power amplifier.

13. The apparatus of claim 4, wherein the second of the three modes couples the first terminal of each of said one or more coils with a first terminal of the power amplifier to open circuit the capacitor.

14. The apparatus of claim 4, wherein the third of the three modes couples a negative terminal of the capacitor in series with the first terminal of each of said one or more coils and couples a positive terminal of the capacitor to a first terminal of the power amplifier.

15. The apparatus of claim 4, wherein the capacitor is charged or discharged by a power supply.

16. The apparatus of claim 4, wherein the capacitor is charged or discharged to a desired voltage level by operation of the amplifier and the switch in response to the voltage waveform.

17. The apparatus of claim 4, wherein the amplifier comprises one of an energy source and an energy sink.

18. The apparatus of claim 4, wherein the switch is synchronized to switch at a point where an average voltage developed on the capacitor reaches a desired average value.

19. The apparatus of claim 4, wherein two or more of the coils are coupled in parallel around said magnetic core.

20. The apparatus of claim 4, wherein two or more of the coils are coupled in series around said magnetic core.

21. The apparatus of claim 4, further comprising a current sensing means coupled in series with the one or more coils to determine a current value flowing through the one or more coils.

22. An apparatus for generating a repetitive time-varying alternating current waveform to create a time-varying magnetic field having a peak value in a magnetic core of a magnet, wherein said repetitive time-varying alternating current waveform alternates from a first constant value to a second constant value, the apparatus comprising:

one or more coils coupled around said magnetic core, wherein each of said one or more coils have a first and second terminal for the application of energizing power;

a voltage source capable of delivering a voltage signal at a voltage level with sufficient electrical power to meet a dissipative loss value on the one or more coils when energized to produce the repetitive time-varying alternating current waveform, wherein the voltage level is selected to produce a maximum rate of change of current in the one or more coils; and a capacitor coupled to the voltage source having a capacitance value sufficient to resonate with the one or more coils at a frequency significantly lower than half of a minimum frequency value of the time-varying magnetic field;

a switch to couple the capacitor to the one or more coils, the switch being able to operate in three modes;

a sensing means to compare the current in the one or more coils with a reference time-dependent programming signal to generate an error signal; and a control means responsive to the error signal for controlling the switch to switch between the application of one of a forward electromotive force, no electromotive force and a reverse electromotive force to the one or more coils to minimize the error signal.

23. The apparatus of claim 22, wherein a first mode of the three modes couples a positive terminal of the capacitor with a first terminal of the one or more coils and a negative terminal of the capacitor with a second terminal of the one or more coils so that the capacitor and the one or more coils are coupled in series.

24. The apparatus of claim 22, wherein a second mode of the three modes couples a first terminal of the one or more coils to a second terminal of the one or more coils to place the capacitor in an open circuit state.

25. The apparatus of claim 22, wherein a third mode of the three modes couples a negative terminal of the capacitor to a first terminal of the one or more coils and a positive terminal of the capacitor to a second terminal of the one or more coils to couple the capacitor in series with the one or more coils.

26. The apparatus of claim 22, wherein the one or more coils are coupled in series around said magnetic core.

27. The apparatus of claim 22, wherein the one or more coils are coupled in parallel around said magnetic core.

28. The apparatus of claim 22 further comprising, an aperture plate insertable in a scanned ion beam at a reference location; and a Faraday cup located in a plane after said aperture plate and connected to a measuring means effective to measure a beam current transmitted through any of a plurality of through holes in the aperture plate.

29. The apparatus of claim 28, wherein the Faraday cup and the measuring means are capable of determining an amplitude and a waveform of the scanned ion beam.

30. A method for generating a waveform that is capable of controlling an apparatus supplying a time-varying current waveform to one or more coils around a magnet having a laminated magnetic core for deflecting a charged particle beam by means of a time-varying magnetic field, wherein the charged particle beam passes in a vacuum through the laminated magnetic core of the magnet, the method comprising the steps of:

varying the time-varying current waveform to the one or more coils to determine one or more amperage values necessary to locate a centroid of a desired ion beam at each of a set of predetermined locations in a reference plane;

generating a data structure to hold one or more conjugate values of the one or more amperage values and the ion beam position at equal tabulated time intervals; and outputting the one or more conjugate values held by the data structure at equidistance time intervals to generate the waveform to instruct the apparatus supplying the time-varying current waveform in order to scan the ion beam in a desired manner.

31. The method of claim 30, further comprising the step of generating one or more interpolated conjugate values to generate a smoothed waveform.

32. The method of claim 30, further comprising the step of controlling a slope of the waveform to smooth transitions between one or more segments.

33. The method of claim 30, further comprising the steps of, generating a second data structure of digitized amperage values by interpolating between known data points to obtain the one or more digitized amperage values; and asserting a digitized programming waveform at equal time increments to achieve a desired time-varying beam position waveform by interpolating between known data points to obtain the desired time-varying current waveform, wherein the equal time increments of the digitized programming waveform are less than time intervals of the programming waveform.

34. The method of claim 30, further comprising the steps of, varying an amperage value of the time-varying current in the one or more coils to determine a desired amperage value required to locate a centroid of each one or more desired ion beams at a pre-determined location in a reference plane.

35. The method of claim 30, wherein the determination of each desired amperage value is performed by transmitting a deflected beam through one or more apertures in an aperture plate provided in the reference plane and adjusting the amperage value to maximize the current signal received in a Faraday cup located in a plane behind said aperture plate.

36. The method of claim 35 further comprising the step of, storing the amperage value in a storage medium.

37. The method of claim 35 wherein the apertures in the aperture plate are equally spaced in at least one dimension.

38. A method for generating a time-varying control waveform to control a desired time-varying electric field in an electrostatic deflector to deflect a charged particle beam, wherein the charged particle beam is passed in a vacuum through the electrostatic deflector, the method comprising the steps of:

varying a control signal to determine a desired control signal to locate a centroid of a desired ion beam within the charged particle beam at each of one or more locations in a reference plane;

generating a data structure to hold one or more conjugate values of the desired control signal and corresponding one or more ion beam positions of the desired ion beam; and generating the time varying control waveform to assert the one or more conjugate values held by the data structure at one or more desired time intervals to program the desired time-varying electric field in the electrostatic deflector.

39. The method of claim 38 wherein the determination of each of the desired control signal values is made by transmitting the deflected beam through each respective through hole in an aperture plate provided in a reference plane and adjusting the control signal to maximize the current signal received in a Faraday cup located in a plane behind said aperture plate.

40. The method of claim 39 further comprising the step of, storing the control signal in a memory device.

41. The method of claim 39 wherein the aperture plate comprises two or more apertures equally spaced in at least one dimension.

42. A switching amplifier to control a current passing through one or more coils of an electromagnet, the switching amplifier comprising:

a voltage source;

a switching circuit capable of switching between two or more states to couple a voltage from the voltage source to the one or more coils, wherein a first state of the switching circuit short circuits each of the one or more coils to result in no electromagnetic field;

a sensing means to compare the current passing through the one or more coils with a time dependent reference programming signal in order to generate an error signal; and a controller responsive to the error signal to control the switching circuit to switch between the one or more states to minimize the error signal.

43. The switching amplifier of claim 42, wherein a second state of the switching circuit applies the voltage from the voltage source in a first direction to create an electromagnetic field which is changing in a first direction.

44. The switching amplifier of claim 42, wherein a third state of the switching circuit applies the voltage from the voltage source in a second direction to create an electromagnetic field which is changing in a second direction.

45. The switching amplifier of claim 42, wherein the electromagnet comprises a laminated magnet for scanning an ion beam across a target.

46. The switching amplifier of claim 42, wherein the electromagnet comprises a laminated magnet for deflecting ion beams to switch one or more desired ion species.

* * * * *